(12) United States Patent
Kumura

(10) Patent No.: US 8,183,610 B2
(45) Date of Patent: May 22, 2012

(54) NONVOLATILE MEMORY AND MANUFACTURING METHOD THEREOF

(75) Inventor: Yoshinori Kumura, Albany, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 358 days.

(21) Appl. No.: 12/549,163

(22) Filed: Aug. 27, 2009

(65) Prior Publication Data

US 2010/0052022 A1    Mar. 4, 2010

(30) Foreign Application Priority Data

Sep. 3, 2008   (JP) ................................. 2008-226416

(51) Int. Cl.
*H01L 27/115* (2006.01)

(52) U.S. Cl. .......... 257/295; 257/E21.664; 257/E27.104

(58) Field of Classification Search .................. 257/295, 257/E21.664, E27.104
See application file for complete search history.

(56) References Cited

U.S. PATENT DOCUMENTS

| 6,121,649 A | 9/2000 | Kunishima |
| 6,198,652 B1 * | 3/2001 | Kawakubo et al. ........... 365/145 |

FOREIGN PATENT DOCUMENTS

JP    2000-031398 A    1/2000

* cited by examiner

*Primary Examiner* — Zandra Smith
*Assistant Examiner* — Paul Patton
(74) *Attorney, Agent, or Firm* — Knobbe, Martens Olson & Bear LLP

(57) ABSTRACT

According to an aspect of the present invention, there is provided a nonvolatile memory including: a cell transistor including: a gate electrode and first and second diffusion layers; a second insulating film covering the cell transistor; first and second plugs penetrating the second insulating film to reach the first and second diffusion layers, respectively; a ferroelectric capacitor having a ferroelectric film and first and second electrodes, the first electrode contacting with the first plug; a first conductive spacer contacting with the second plug and including the same material as the first electrode; a third insulating film covering side faces of the first electrode, the ferroelectric film and the first conductive spacer; and a first wiring that is continuously formed with the second electrode and connected to the first conductive spacer and that includes the same material as the second electrode.

12 Claims, 12 Drawing Sheets

NONVOLATILE MEMORY AND MANUFACTURING METHOD THEREOF

CROSS-REFERENCE TO RELATED APPLICATIONS

This application claims priority from Japanese Patent Application No. 2008-226416 filed on Sep. 3, 2008, the entire contents of which are incorporated herein by reference.

BACKGROUND OF THE INVENTION

1. Field of the Invention

An aspect of the present invention relates to nonvolatile memory and a manufacturing method thereof.

2. Description of the Related Art

Recently, attention has been focused on a nonvolatile memory using a ferroelectric substance, such as lead zirconate titanate (PZT: $P(Zr, Ti)O_3$), strontium bismuth tantalite (SBT: $SrBi_2Ta_2O_9$), etc., as a capacitor insulting film, because of its high speed and low power consumption characteristics.

In nonvolatile memory of the type wherein each cell transistor as a switching element is first formed and then each ferroelectric capacitor is formed thereabove through an interlayer insulating film, wiring passing through a contact hole formed in the interlayer insulating film is used as electrical connection between an upper electrode of the ferroelectric capacitor and a source/drain region of the cell transistor. (For example, refer to JP-2000-031398-A.)

The Nonvolatile memory disclosed in JP-2000-031398-A includes a transistor having a source/drain region and a gate, an insulating film formed on a semiconductor substrate so as to cover the gate and having a contact hole, a capacitor formed on the insulating film and including a lower electrode, a ferroelectric film formed on the lower electrode and an upper electrode formed on the ferroelectric film, a sidewall insulting film for covering the side faces of the lower electrode and the ferroelectric film, and wiring for electrical connection between the upper electrode and the source/drain region. The wiring is insulated from the lower electrode by the side wall insulting film and is formed to reach the source/drain region through the contact hole.

The material of the wiring is the same as that of the upper electrode at least thereabout, and the upper electrode and the wiring are continuously joined.

However, for the nonvolatile memory of JP-2000-031398-A, a lithographic step to form the lower electrode and a lithographic step to form the contact hole are executed separately.

Between two steps each using masks, misalignment will occur between the first and second masks, and a margin to allow a misalignment amount is required. Consequently, integrating of nonvolatile memory is hindered.

SUMMARY OF THE INVENTION

According to an aspect of the present invention, there is provided a nonvolatile memory including: a semiconductor substrate; a cell transistor including: a gate electrode that is formed on a main face of the semiconductor substrate through a gate insulating film; a first insulating film that covers a top face and a side face of the gate electrode; and first and second diffusion layers that are formed so as to sandwich the gate electrode therebetween in a gate length direction; a second insulating film that is formed on the semiconductor substrate so as to cover the cell transistor; a first contact plug that penetrates the second insulating film so as to be connected to the first diffusion layer; a second contact plug that penetrates the second insulating film so as to be connected to the second diffusion layer; a ferroelectric capacitor in which a ferroelectric film is sandwiched between first and second electrodes and in which the first electrode contacts with a top face of the first contact plug; a first conductive spacer that contacts with a top face of the second contact plug and that includes the same material as the first electrode; a third insulating film that is formed on the second insulating film so as to cover side faces of the first electrode, the ferroelectric film and the first conductive spacer and that has a first opening to expose a top face of the first conductive spacer; and a first wiring that is formed on the third insulating film so as to have one part continuously formed with the second electrode and the other part connected to the first conductive spacer through the first opening and that includes the same material as the second electrode.

According to another aspect of the present invention, there is provided a method for manufacturing a nonvolatile memory, the method including: forming a cell transistor having a gate electrode and first and second diffusion layers on a main face of a semiconductor substrate; forming a second insulating film on the semiconductor substrate so as to cover the cell transistor; forming a first contact plug that penetrates the second insulating film so as to be connected to the first diffusion layer and a second contact plug that penetrates the second insulating film so as to be connected to the second diffusion layer; forming a first electrode that contacts with a top face of the first contact plug and a first conductive spacer that contacts with a top face of the second contact plug, by: forming a first electrode material film on the second insulating film; forming a mask material on the first electrode material film; and etching the first electrode material film by use of the mask material; forming a third insulating film on the second insulating film to cover side faces of the first electrode, the first conductive spacer and the mask material; removing the mask material on the first electrode; forming a ferroelectric film on the first electrode; removing the mask material on the first conductive spacer; and forming a first wiring that is connected to a top face of the ferroelectric film and a top face of the first conductive spacer.

DETAILED DESCRIPTION OF THE INVENTION

Embodiments of the invention will be discussed with reference to the accompanying drawings.

Figure 1:
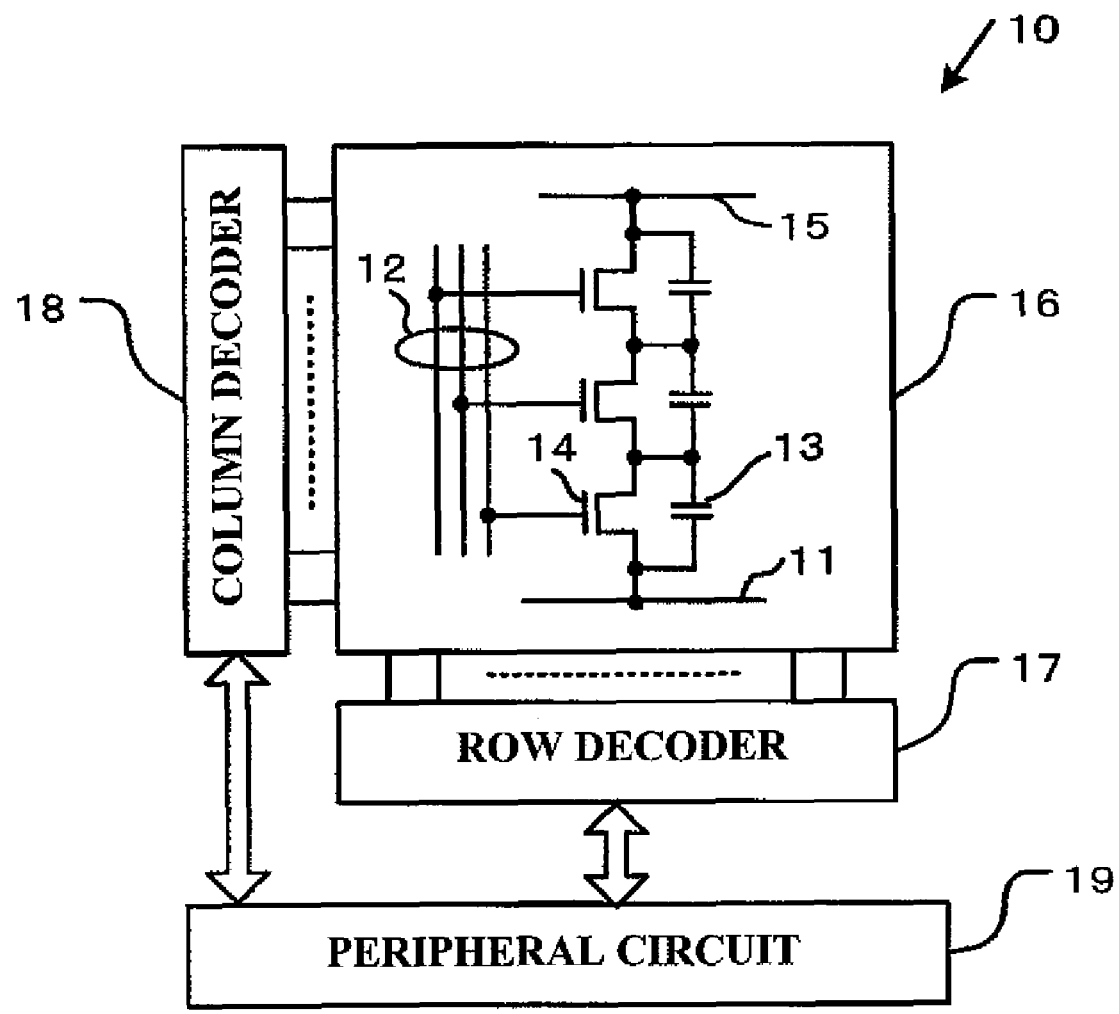
FIG. 1 is a block diagram of nonvolatile memory according to a first embodiment of the invention.
Figure 2:
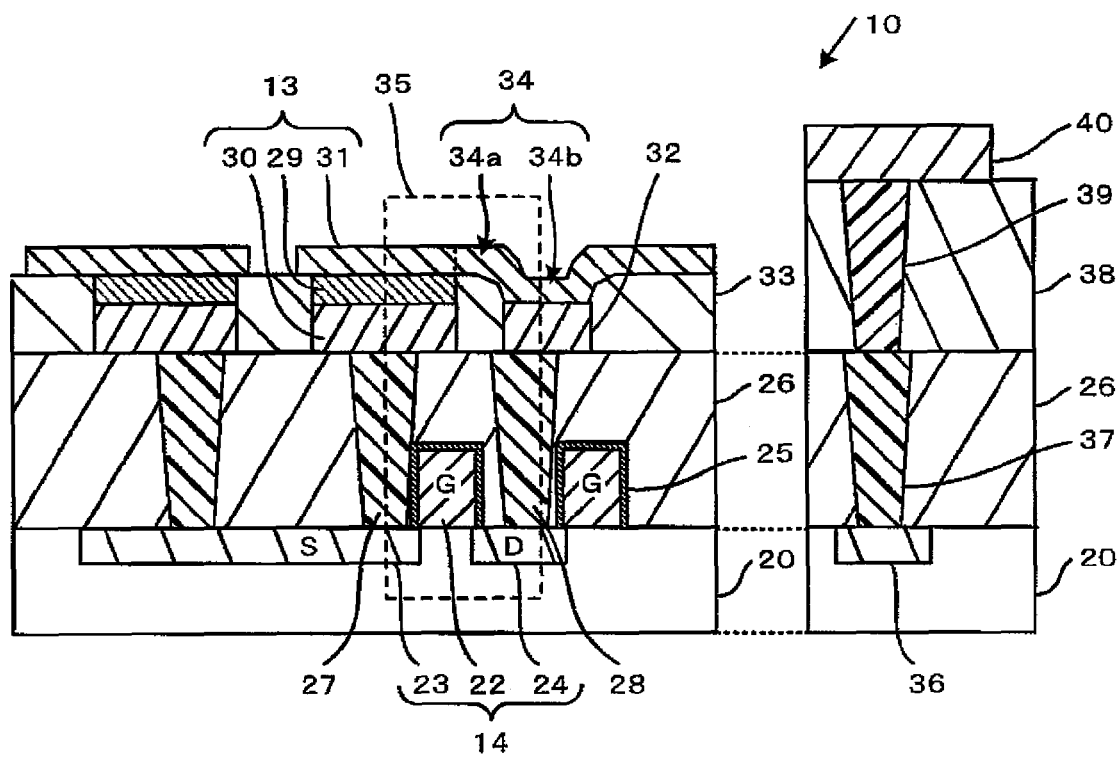
FIG. 2 is a sectional view of the nonvolatile memory according to the first embodiment.

Nonvolatile memory according to a first embodiment of the invention will be discussed with FIGS. 1 and 2. FIG. 1 is a block diagram of nonvolatile memory, and FIG. 2 is a sectional view of the nonvolatile memory.

In the embodiment, a nonvolatile memory having capacitor cells of transistor (T)-capacitor (C) parallel unit series connection type wherein a plurality of unit cells each having a cell transistor and a ferroelectric capacitor connected in parallel are connected in series symmetrically in a horizontal direction.

As shown in FIG. 1, a nonvolatile memory 10 of the embodiment includes a memory cell array 16 including bit lines 11 and word lines 12 arranged like a matrix, ferroelectric capacitors 13 each placed in the crossing point of the bit line 11 and the word line 12 and having a ferroelectric film sandwiched between first and second electrodes, switching cell transistors 14 each having a drain D connected to the bit line 11, a source S connected to the first electrode of the ferroelectric capacitor 13, and a gate G connected to the word line 12, and common wiring 15 connected to the second electrodes of the ferroelectric capacitors 13.

The nonvolatile memory 10 further includes a row decoder 17 and a column decoder 18 for selecting any ferroelectric capacitor 13 in the memory cell array 16 and a peripheral circuit 19 for driving the row decoder 17 and the column decoder 18 for reading data from the selected ferroelectric capacitor 13 and sending the data to the outside and writing data acquired from the outside to the selected ferroelectric capacitor 13.

As shown in FIG. 2, the memory cell array 16 is formed on a semiconductor substrate 20, for example, a silicon substrate.

Each cell transistor 14 is formed in an area surrounded by an element isolation region (not shown) formed in the semiconductor substrate 20.

The cell transistor 14 includes a gate electrode 22 formed on the semiconductor substrate 20 through a gate insulating film (not shown) and a first diffusion layer 23 (source diffusion layer) and a second diffusion layer 24 (drain diffusion layer) formed so as to sandwich the gate electrode 22 in the gate length direction. A top face and side faces of the gate electrode 22 are covered with a first insulating film 25.

A second insulating film 26 (interlayer insulating film) is formed on the semiconductor substrate 20 so as to cover the cell transistors 14.

First contact plugs 27 each connected to the first diffusion layer 23 through a contact hole penetrating the second insulating film 26 are formed and second contact plugs 28 each connected to the second diffusion layer 24 through a contact hole penetrating the second insulating film 26 are formed.

The first contact plug 27 and the second contact plug 28 are electrically insulated from the gate electrode 22 by the first insulating film 25 formed on the side faces of the gate electrode 22.

The ferroelectric capacitor 13 has a ferroelectric film 29 sandwiched between a first electrode 30 and a second electrode 31. The ferroelectric capacitor 13 is formed on the second insulating film 26 from the first contact plug 27 toward the center of the gate electrode 22. The height of the ferroelectric capacitor 13 is about 400 nm, for example.

The first electrode 30 is in contact with the top face of the first contact plug 27 and is electrically connected to the first contact plug 27.

A first conductive spacer 32 of the same material as the first electrode 30 is formed on the second insulating film 26 from the second contact plug 28 toward the center of a gate electrode adjacent to the gate electrode 22.

The first conductive spacer 32 is in contact with the top face of the second contact plug 28 and is electrically connected to the second contact plug 28.

A third insulating film 33 is formed on the second insulating film 26 so as to cover the side faces of the first electrode 30, the ferroelectric film 29 and the first conductive spacer 32, and has a first opening to expose the top face of the first conductive spacer 32.

First wiring 34 that is formed of the same material as the second electrode 31 has one part 34a continuously joined to the second electrode 31 and the other part 34b connected to the first conductive spacer 32 through the first opening on the third insulating film 33.

Accordingly, the upper electrode 31 of the ferroelectric capacitor 13 is electrically connected to the second contact plug 28 of the cell transistor 14 through the first wiring 34, the first conductive spacer 32, and the second contact plug 28.

A material having smaller specific resistance than the second electrode 31 is selected as the first electrode 30. For example, the first electrode 30 is formed of a metal material, such as iridium (Ir, $\rho \sim 5.3 \times 10^{-8}$ $\Omega \cdot m$), platinum (Pt, $\rho \sim 10.6 \times 10^{-8}$ $\Omega \cdot m$) and ruthenium (Ru, $\rho \sim 7.6 \times 10^{-8}$ $\Omega \cdot m$), and the second electrode 31 is formed of an oxide conductive material, such as iridium oxide ($IrO_2$, $\rho \sim 40 \times 10^{-8}$ $\Omega \cdot m$), strontium oxide ($SrO_2$), ruthenium oxide ($RuO_2$) and SRO.

Consequently, the whole wiring resistance can be decreased as compared with the case where the second electrode 31 of the ferroelectric capacitor 13 and the second diffusion layer 24 of the cell transistor 14 are electrically connected by only the first wiring 34 of the same material as the second electrode 31 as conventional.

Accordingly, a unit cell 35 in which the first electrode 30 of the ferroelectric capacitor 13 connected to the first diffusion layer 23 of the cell transistor 14 and the second electrode 31 of the ferroelectric capacitor 13 connected to the second diffusion layer 24 is formed.

A plurality of unit cells 35 are connected in series symmetrically in the horizontal direction, and a capacitor cell of transistor (T)-capacitor (C) parallel unit series connection type is formed.

The first electrode 30, the ferroelectric film 29 and the first conductive spacer 32 and the first opening 54 are patterned in the same step.

Consequently, in a step of electrically connecting the second electrode 31 to the second diffusion layer 24, only one photolithography step is needed, and it is not necessary to provide a margin for mask misalignment.

Therefore, electric connection between the second electrode 31 of the ferroelectric capacitor 13 and the second diffusion layer 24 of the cell transistor 14 is facilitated, and the higher integration of the nonvolatile memory 10 is advanced.

In the peripheral circuit 19, a third contact plug 37 is formed penetrating the second insulating film 26 on a third diffusion layer 36 of a peripheral circuit transistor.

The third diffusion layer 36 is electrically connected to wiring 40 through a fourth contact plug 39 penetrating an interlayer insulating film 38.

Next, a manufacturing method of the nonvolatile memory 10 will be discussed. FIGS. 3A to 7B are sectional views of manufacturing steps of the nonvolatile memory 10.

At first, STI (Shallow Trench Isolation) for element isolation not shown is formed in a semiconductor substrate 20 according to a known method.

Figure 3A:
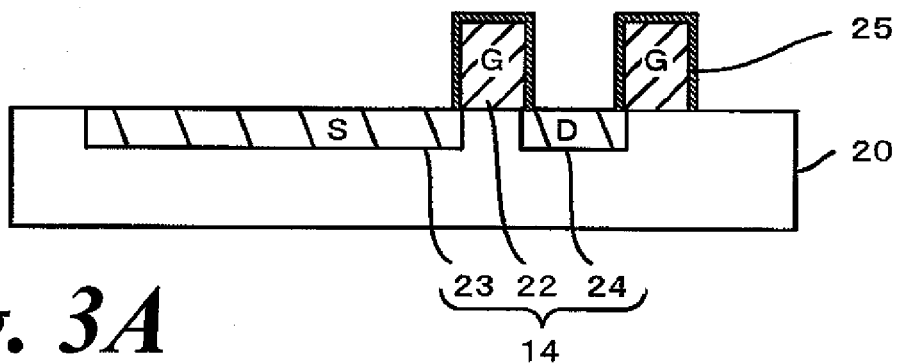
FIGS. 3A, 3B and 3C are sectional views of manufacturing steps of the nonvolatile memory according to the first embodiment.

Next, as shown in FIG. 3A, a cell transistor 14 having a gate electrode 22 through a gate insulating film (not shown) and a first diffusion layer 23 and a second diffusion layer 24 so as to sandwich the gate electrode 22 in the gate length direction is formed on the semiconductor substrate 20, and a first insulating film 25 is formed on the top face and side faces of the gate electrode 22.

Figure 3B:
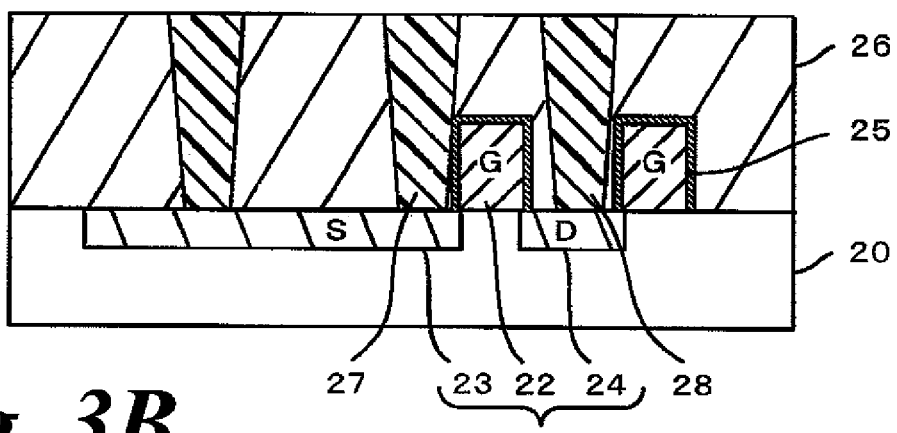

Next, as shown in FIG. 3B, a second insulating film 26 such as a BPSG (Boron Phosphorous Silicate Glass) film is formed on the semiconductor substrate 20, and through holes to form the second insulating film 26 with a first contact plug 27 and a second contact plug 28 are formed.

Next, a conductive film (not shown) such as a TiN barrier metal film is formed by a sputtering method, etc. on the second insulating film 26 so as to fill the through holes, a tungsten film is formed by a CVD (Chemical Vapor Deposition) method, and an extra conductive film is removed until the second insulating film 26 is exposed by a CMP (Chemical Mechanical Polishing) method.

Accordingly, the first contact plug 27 connected to the first diffusion layer 23 and the second contact plug 28 connected to the second diffusion layer 24 are formed.

Figure 3C:
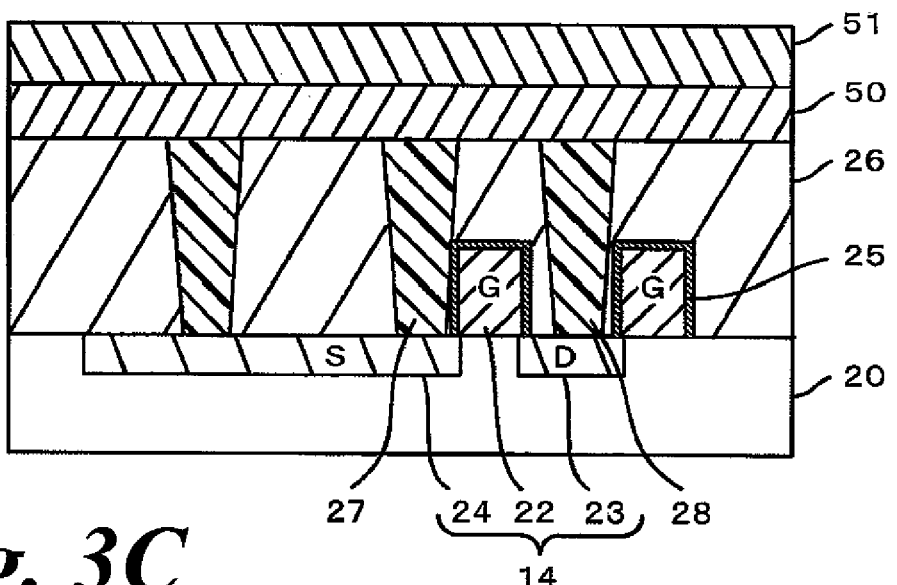

Next, as shown in FIG. 3C, an iridium (Ir) film having a thickness of about 200 nm is formed as a first electrode material film 50, for example, by a sputtering method, and a silicon nitride film having a thickness of about 100 nm is formed, for example as a cap layer 51, by a PCVD method, in order on the second insulating film 26 and on the top faces of the first contact plug 27 and the second contact plug 28.

The first electrode material film 50 is formed of a metal material having a high melting point, such as Pt or Ru, in addition to Ir.

Figure 4A:
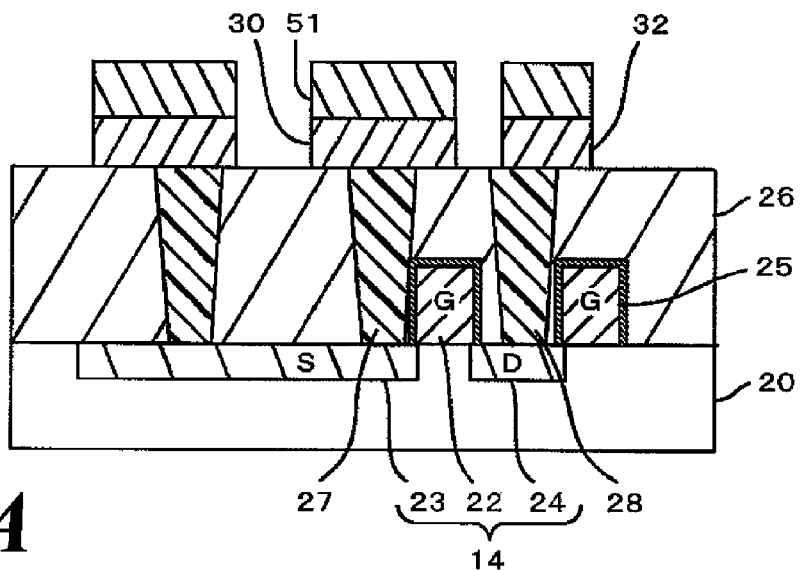
FIGS. 4A and 4B are sectional views of manufacturing steps of the nonvolatile memory according to the first embodiment.

Next, as shown in FIG. 4A, a resist film (not shown) having a given pattern is formed on the cap layer 51 by a photolithography method, and the cap layer 51 is etched by an RIE (Reactive Ion Etching) method with the resist film as a mask.

Next, the first electrode material film 50 is etched by the RIE method with the cap layer 51 to which the pattern has been transferred as a mask.

Accordingly, a first electrode 30 in contact with the top face of the first contact plug 27 and extending from the first contact plug 27 toward the center of the gate electrode 22 and a first conductive spacer 32 in contact with the top face of the second contact plug 28 and extending from the second contact plug 28 toward the center of a gate electrode adjacent to the gate electrode 22 are formed on the second insulating film 26.

Figure 4B:
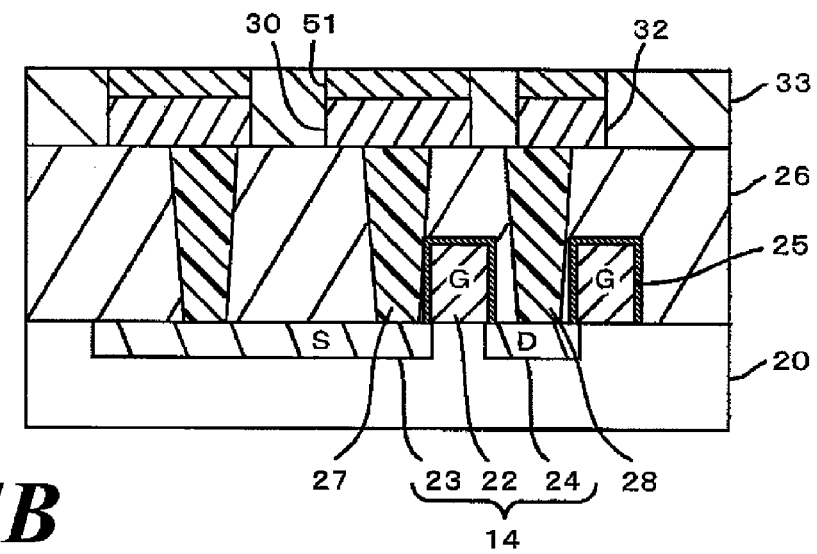

Next, as shown in FIG. 4B, an aluminum oxide ($Al_2O_3$) film functioning as a hydrogen diffusion barrier film is formed, for example, by a sputtering method or an ALD (Atomic Layer Deposition) method as a third insulating film 33 on the second insulating film 26, the first electrode 30, the first conductive spacer 32 and the cap layer 51, and an extra aluminum oxide film is removed until the cap layer 51 is exposed by a CMP method.

Figure 5A:
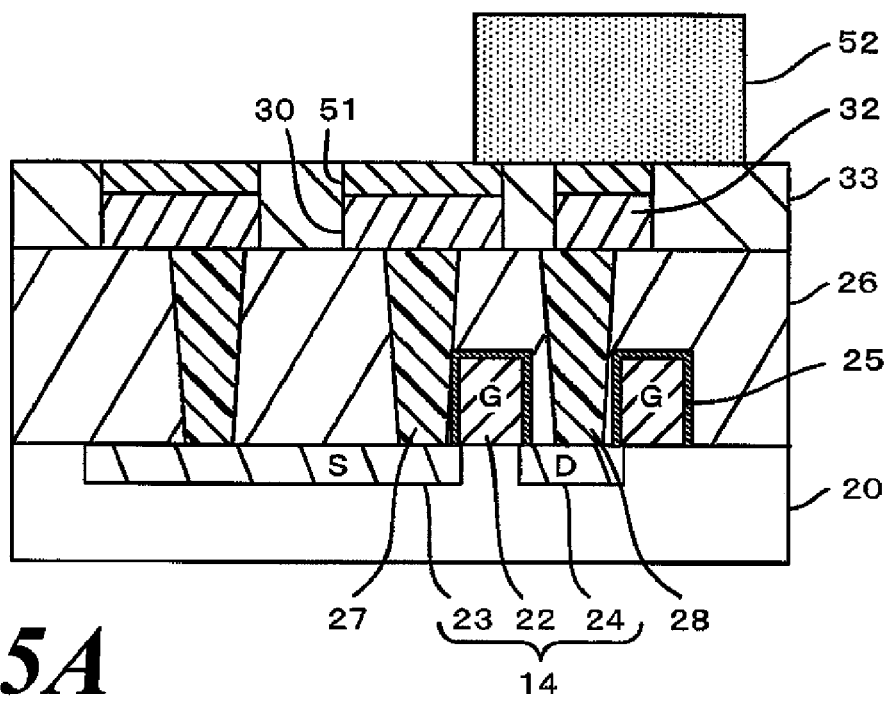
FIGS. 5A and 5B are sectional views of manufacturing steps of the nonvolatile memory according to the first embodiment.

Next, as shown in FIG. 5A, a resist film 52 covering the cap layer 51 on the first conductive spacer 32 is formed. Since the resist film 52 is provided simply to protect the cap layer 51 when being wet-etched, the resist film 52 may be coarsely formed.

For example, the resist film 52 may be formed across a part of the cap layer 51 on the first electrode 30.

Figure 5B:
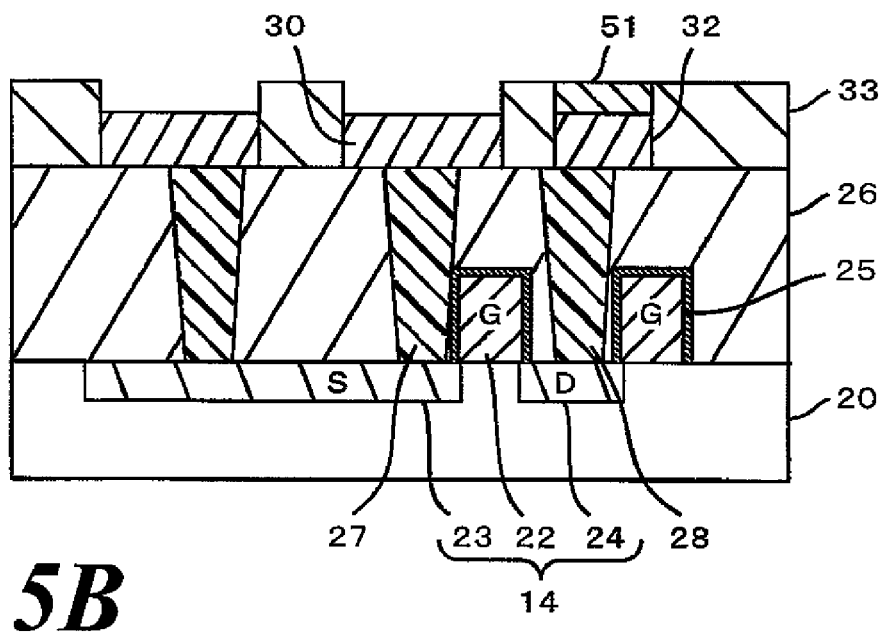

Next, as shown in FIG. 5B, the cap layer 51 on the first electrode 30 is removed at room temperature using an etchant for selectively etching a silicon nitride film relative to aluminum oxide, for example, phosphoric acid to expose the top face of the first electrode 30.

Next, the resist film 52 is removed using usher, a mixture liquid of sulfuric acid and hydrogen peroxide (SH), etc., for example.

Figure 6A:
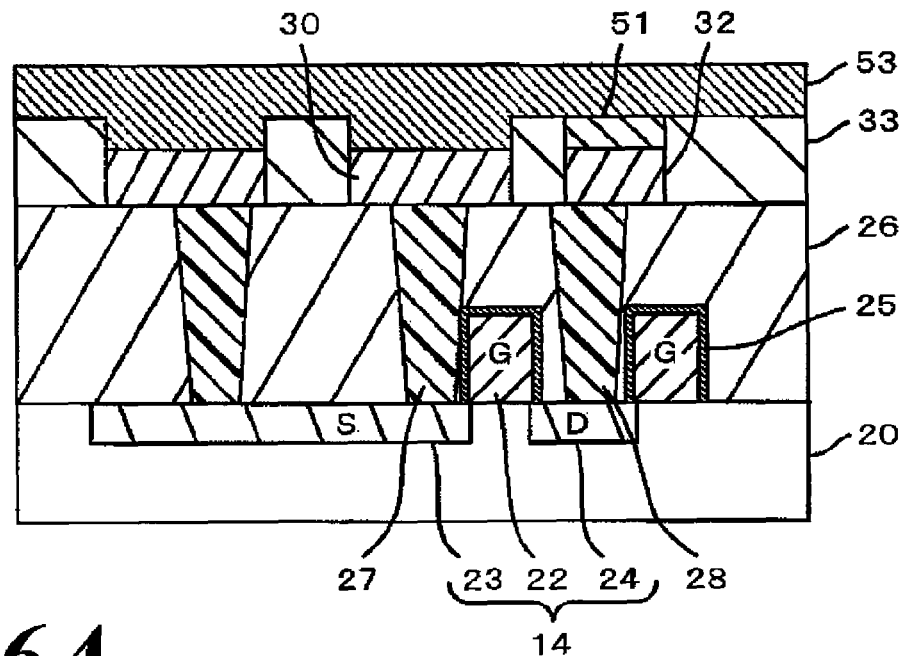
FIGS. 6A and 6B are sectional views of manufacturing steps of the nonvolatile memory according to the first embodiment.

Next, as shown in FIG. 6A, a PZT film 53 is formed, for example, by a sputtering method on the third insulating film 33 and on the top faces of the first electrode 30 and the cap layer 51.

Figure 6B:
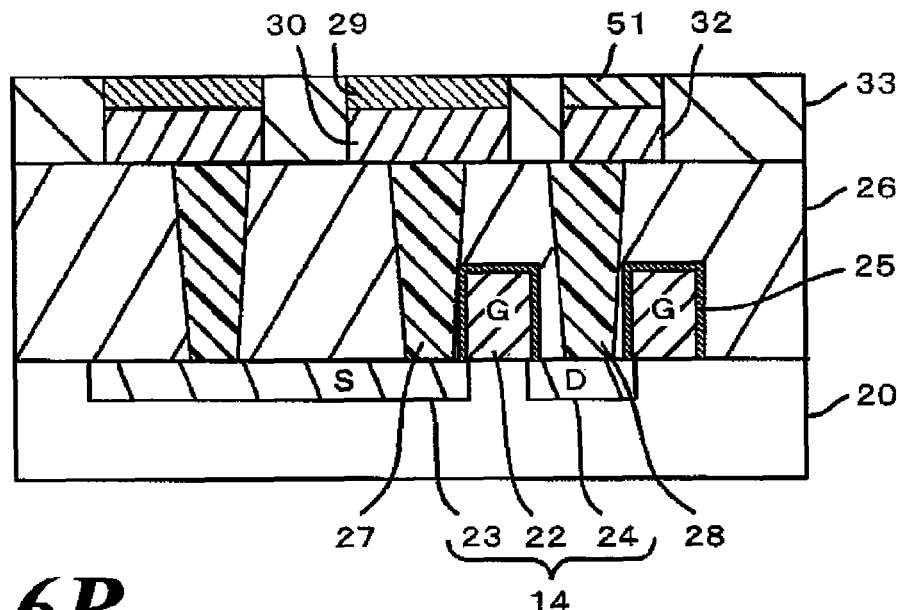

Next, as shown in FIG. 6B, an extra PZT film 53 is removed by a CMP method until the third insulating film 33 and the cap layer 51 on the first conductive spacer 32 are exposed.

Figure 7A:
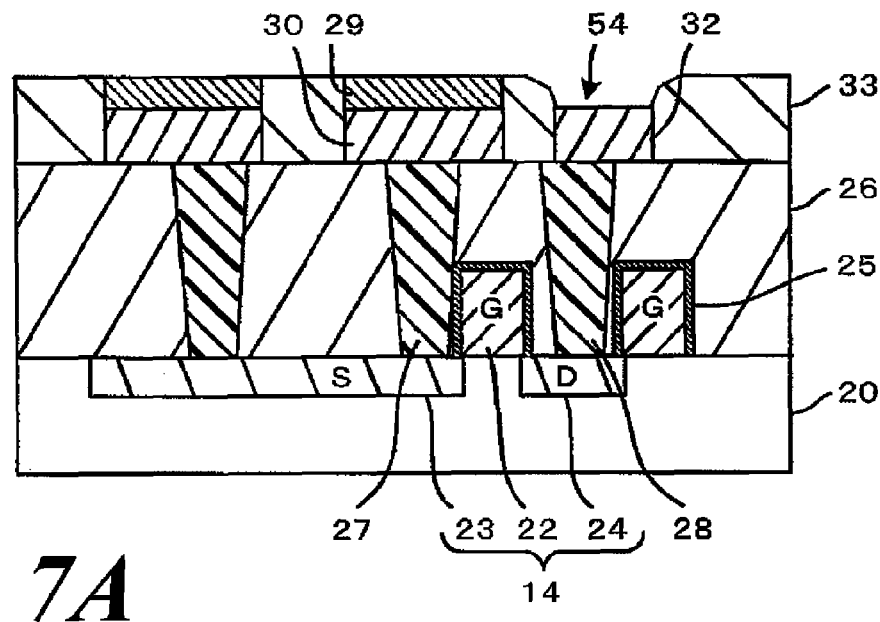
FIGS. 7A and 7B are sectional views of manufacturing steps of the nonvolatile memory according to the first embodiment.

Next, as shown in FIG. 7A, the cap layer 51 on the first conductive spacer 32 is removed selectively at room temperature using phosphoric acid to expose the top face of the first conductive spacer 32. The phosphoric acid selectively etches a silicon nitride film relative to PZT like aluminum oxide.

Accordingly, the third insulating film 33 formed on the second insulating film 26 so as to cover the side faces of the first electrode 30, the ferroelectric film 29 and the first conductive spacer 32, and having a first opening 54 to expose the top face of the first conductive spacer 32 is provided.

Figure 7B:
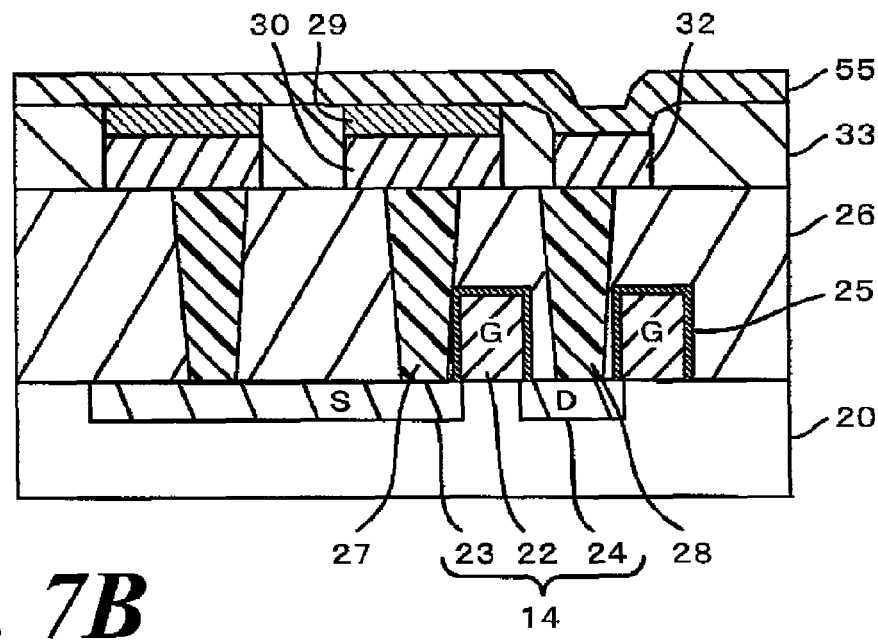

Next, as shown in FIG. 7B, iridium oxide ($IrO_2$) of a conductive metal oxide is formed, for example, by a sputtering method as a second electrode material film 55 on the third insulating film 33, a ferroelectric film 29 and the first conductive spacer 32.

Next, a resist film (not shown) having an electrode wiring pattern is formed on the second electrode material film 55 by a photolithography method, and the second electrode material film 55 is etched by an RIE method with the resist film as a mask.

Accordingly, there is formed a ferroelectric capacitor 13 in which a ferroelectric film 29 is sandwiched between a first electrode 30 and a second electrode 31, in which the first electrode 30 is in contact with the top face of the first contact plug 27, and in which a first wiring 34 having one part 34a continuously joined to the second electrode 31 and the other part 34b connected to the first conductive spacer 32 through the first opening 54, as shown in FIG. 1.

The other part 34b of the first wiring 34 is a self-align contact formed in a self-alignment manner relative to the first opening 54.

In the peripheral circuit 19, a third diffusion layer 36 of a peripheral circuit transistor and a third contact plug 37 are formed in the same step as the cell transistor and the first and second contact plugs 27 and 28.

An interlayer insulating film 38, a fourth contact plug 39, and wiring 40 of the peripheral circuit 19 are formed in a separate step from the memory cell array 16.

Accordingly, nonvolatile memory 10 having a capacitor cell of transistor (T)-capacitor (C) parallel unit series connection type is provided.

As described above, the nonvolatile memory 10 of the embodiment includes the first wiring 34 having one part 34a continuously joined to the second electrode 31 and the other part 34b connected to the first conductive spacer 32 through the first opening 54, on the third insulating film 33.

Since the first electrode 30, the ferroelectric film 29, the first conductive spacer 32, and the first opening 54 can be patterned in the same step, only one photolithography step is required to electrically connect the second electrode 31 to the second diffusion layer 24. Therefore, a margin for mask misalignment is not required.

Consequently, since electric connection between the second electrode 31 of the ferroelectric capacitor 13 and the second diffusion layer 24 of the cell transistor 14 is facilitated and fine contacts can be formed easily, higher integration of the nonvolatile memory 10 is advanced.

Figure 12:
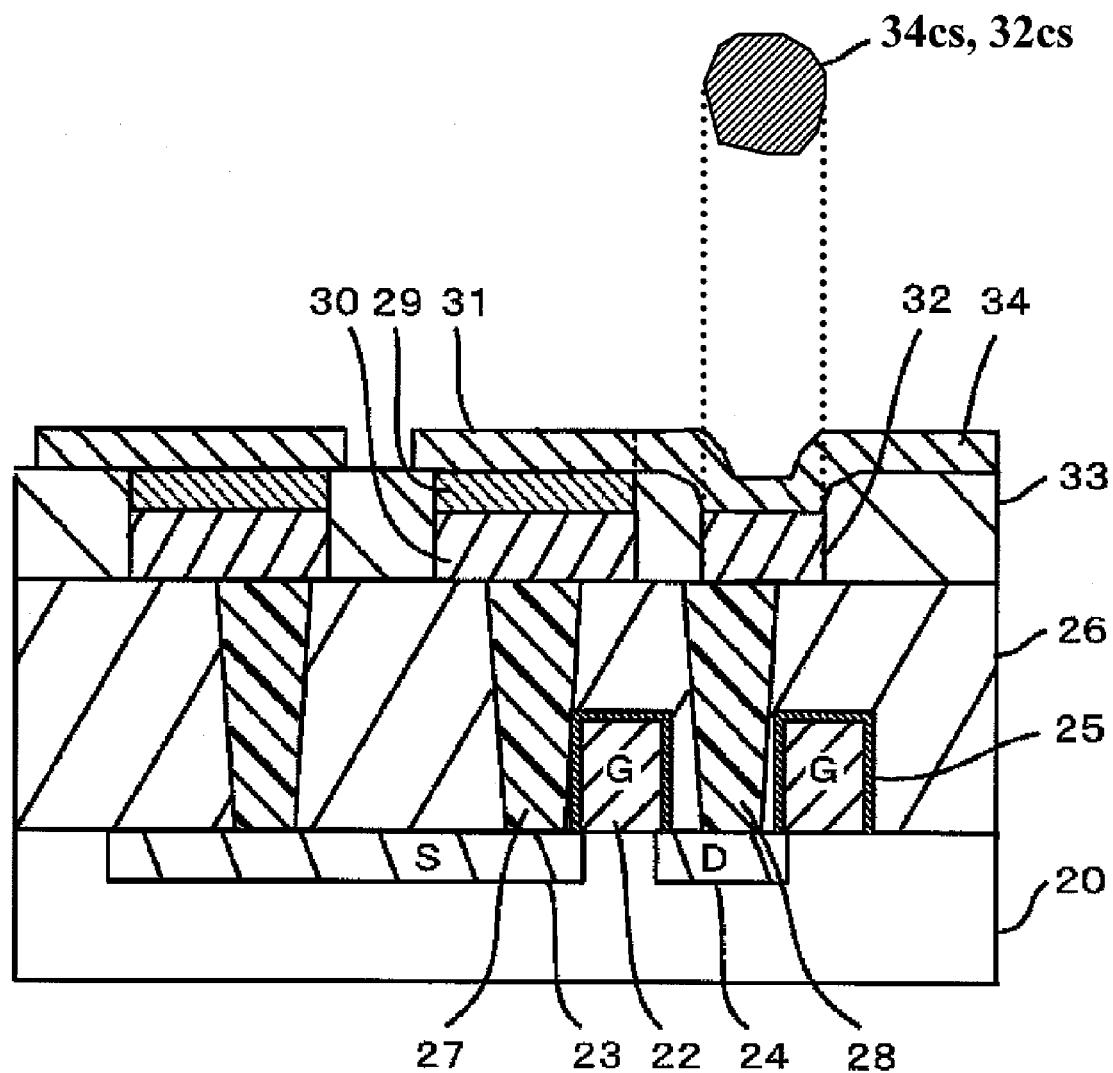
FIG. 12 illustrates contacting surfaces of a first wiring and of a first conductive spacer in the nonvolatile memory according to the first embodiment.

Further, as shown in FIG. 12, no misalignment occurs between the first wiring 34 and the first conductive spacer 32 so that the first wiring 34 and the first conductive spacer 32 have the same surface shape at the contacting surfaces 34cs, 32cs thereof. Therefore, the contacting area therebetween is maximized, thereby minimizing the resistance.

Therefore, there are provided a nonvolatile memory in which the wiring connecting the second electrode 31 of the ferroelectric capacitor 13 and the second diffusion layer 24 of the cell transistor 14 is formed in a self-alignment manner and a manufacturing method thereof.

The first conductive spacer 32 is formed of the same material as the first electrode 30, and the first wiring 34 is formed of the same material as the second electrode 31.

Since the specific resistance of the first electrode 30 is smaller than that of the second electrode 31, the whole wiring resistance is decreased as compared with the case where the second electrode 31 of the ferroelectric capacitor 13 and the second diffusion layer 24 of the cell transistor 14 are electrically connected by only the wiring of the same material as the second electrode 31 as conventional.

Second Embodiment

Figure 8:
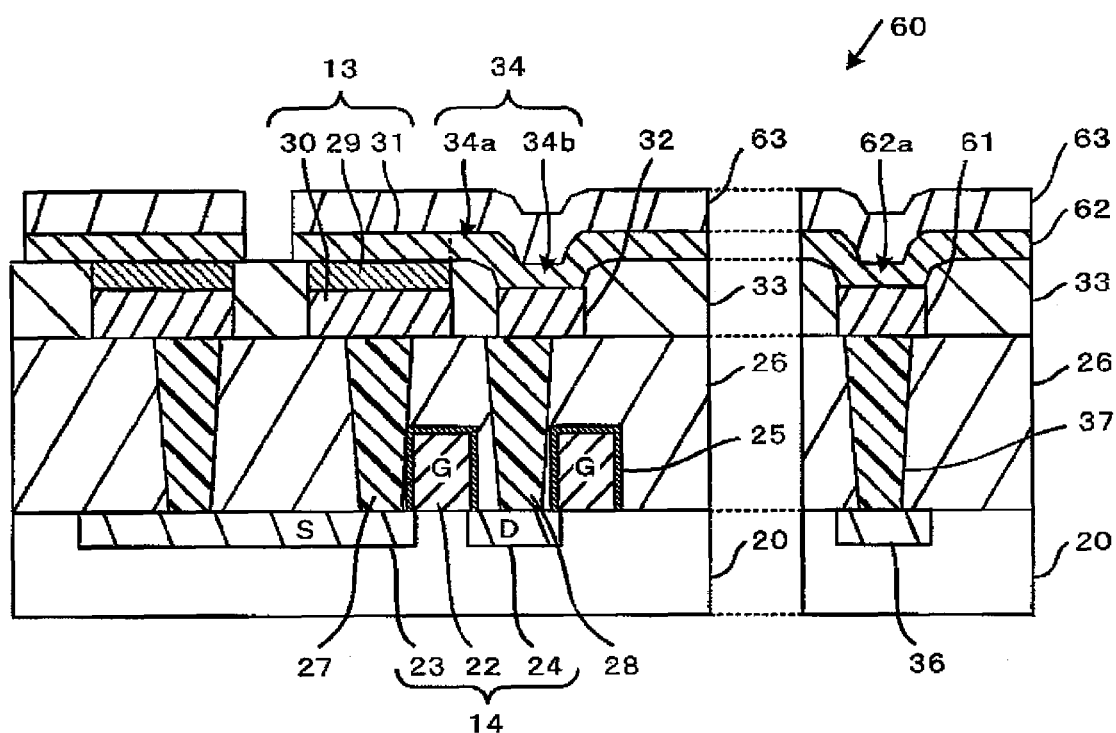
FIG. 8 is a sectional view of nonvolatile memory according to a second embodiment of the invention.

FIG. 8 is a sectional view of a nonvolatile memory according to a second embodiment of the invention. Components identical with those of the first embodiment are denoted by the same reference numerals in FIG. 8, etc., and will not be discussed again.

The second embodiment differs from the first embodiment in that a diffusion layer and wiring of each transistor in a peripheral circuit are connected by a self-align contact like a cell transistor, and a metal film having smaller specific resistance than a wiring material is formed on the wiring.

As shown in FIG. 8, in a nonvolatile memory 60 of the second embodiment, the transistor of the peripheral circuit includes a third contact plug 37 penetrating a second insulating film 26 and connected to a third diffusion layer 36 of the peripheral circuit transistor, a second conductive spacer 61 of the same material as a first electrode 30, and second wiring 62 of the same material as a second electrode 31. The second wiring 62 has a part 62a formed to be connected to the second conductive spacer 61 through a second opening on a third insulating film 33 having the second opening to expose the top face of the second conductive spacer 61.

Further, the nonvolatile memory 60 includes a metal film 63 that is formed on the second electrode 31 of the ferroelectric capacitor 13, on the first wiring 34 of the cell transistor 14, and on the second wiring 62 of the peripheral circuit transistor and that is formed of, for example, aluminum (Al, ρ~2.6× $10^{-8}$ Ω·m).

The metal film 63 is provided to decrease the wiring resistance in the peripheral circuit transistor. The metal film 63 has smaller specific resistance than the second wiring 62 and thus functions substantially as wiring of the peripheral circuit transistor.

In the peripheral circuit, the third diffusion layer 36 of the transistor and the wiring can be connected easily by a self-align contact like the cell transistor 14, and the resistance of the wiring can be decreased, thereby enabling the peripheral circuit transistor to drive a larger operation current as compared with the cell transistor 14.

Figure 9A:
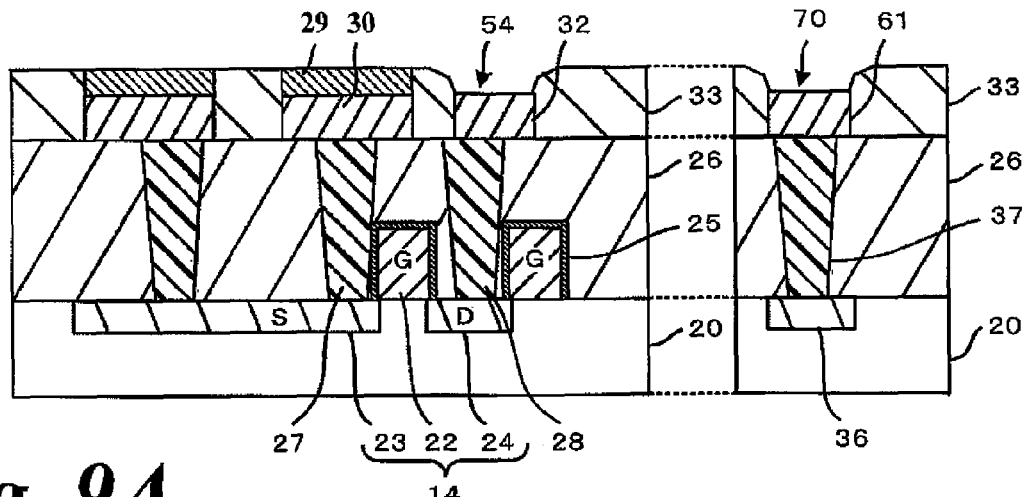
FIGS. 9A and 9B are sectional views of manufacturing steps of the nonvolatile memory according to the second embodiment.
Figure 9B:
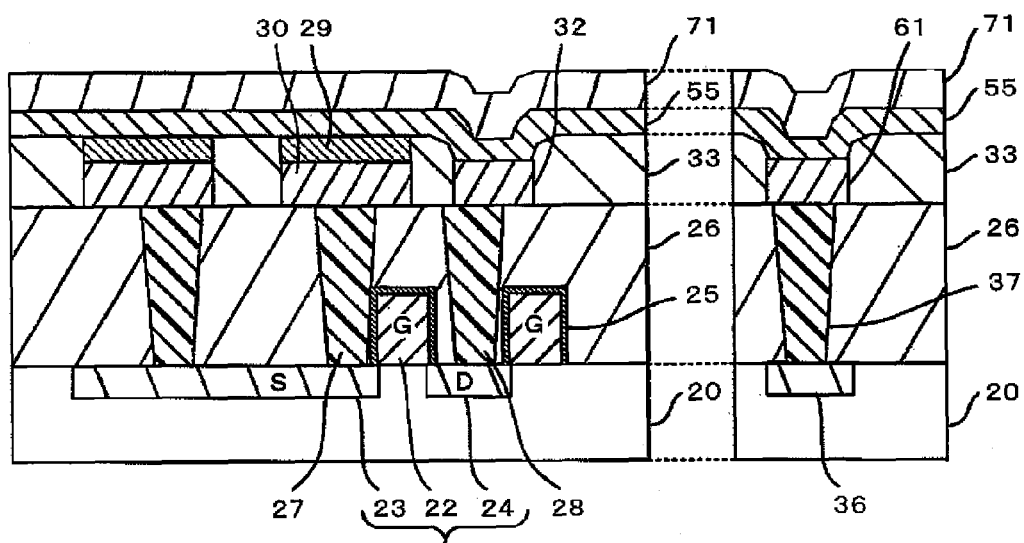

Next, a manufacturing method of the nonvolatile memory 60 will be discussed. FIGS. 9A and 9B are sectional views of manufacturing steps of the nonvolatile memory 60.

As shown in FIG. 9A, a peripheral circuit transistor is formed at the same time as a cell transistor 14, a third contact plug 37 penetrating a second insulating film 26 and connected to a third diffusion layer 36 of the peripheral circuit transistor is formed, a second conductive spacer 61 in contact with the top face of the third contact plug 37 is formed, and a second opening 70 to cover side faces of the second conductive spacer 61 with a third insulating film 33 and expose the top face of the second conductive spacer 61 is formed in a similar manner to that in FIGS. 3A to 7B.

Next, as shown in FIG. 9B, a second electrode material film 55 and an aluminum (Al) film 71 are formed in order on the third insulating film 33, a ferroelectric film 29, a first conductive spacer 32 and the second conductive spacer 61.

Next, a resist film (not shown) having an electrode wiring pattern is formed on the aluminum film 71 by a photolithography method, and the aluminum film 71 and the second electrode material film 55 are etched by an RIE method with the resist film as a mask.

Accordingly, the ferroelectric capacitors 13, the first wiring 34 and the second wiring 62 having the intermediate part 62a connected to the second conductive spacer 61 through the second opening 70 shown in FIG. 8 are provided.

The intermediate part 62a of the second wiring 62 is a self-align contact formed in a self-alignment manner relative to the second opening 70.

As described above, the nonvolatile memory 60 of the embodiment includes the second wiring 62 having the intermediate part 62a connected to the second conductive spacer 61 through the second opening 70 on the third insulating film 33 and the metal film 63 formed on the second wiring 62.

As a result, the wiring resistance of the peripheral circuit transistor is decreased, it becomes easy to form fine contacts also in the peripheral circuit 19, and higher integration of the nonvolatile memory 60 is advanced.

Further, no misalignment occurs between the second wiring 62 and the second conductive spacer 61 so that the second wiring 62 and the second conductive spacer 61 have the same surface shape at the contacting surfaces thereof. Therefore, the contacting area therebetween is maximized, thereby minimizing the resistance.

Further, in the embodiment, the manufacturing steps can be shortened because most of the manufacturing steps of the peripheral circuit 19 can be made common.

Although the case where the metal film 63 is formed on the second electrodes 31, the first wiring 34 and the second wiring 62 has been described, the metal film 63 may be formed at least on the second wiring 62 and thus may not be formed on the second electrodes 31 or the first wiring 34.

Although the case where the metal film 63 is aluminum has been described, copper (Cu) having smaller specific resistance may be used.

FIGS. 10A to 11B are sectional views of manufacturing steps of different nonvolatile memory where the metal film is copper.

Figure 10A:
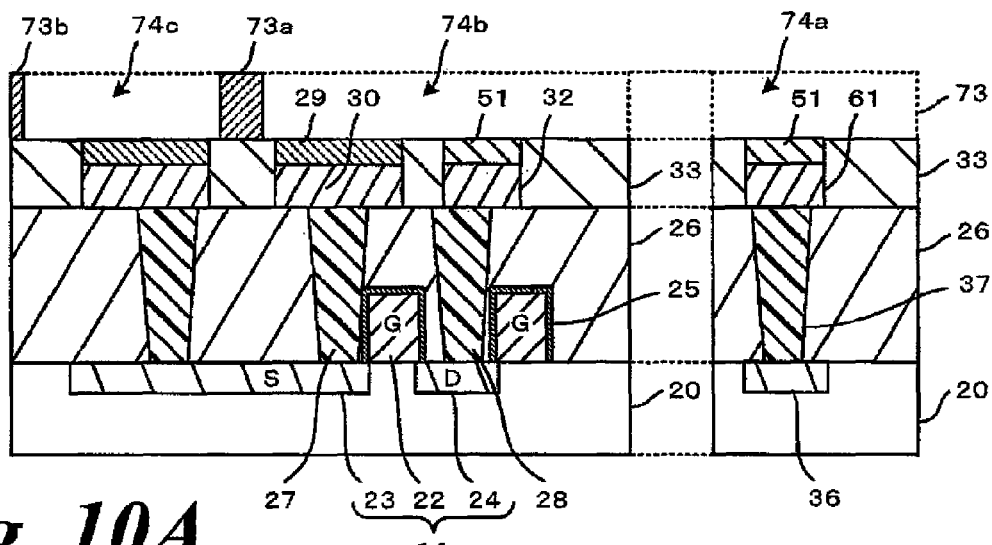
FIGS. 10A and 10B are sectional views of manufacturing steps of different nonvolatile memory according to the second embodiment.

As shown in FIG. 10A, a peripheral circuit transistor is formed at the same time as a cell transistor 14, a third contact plug 37 penetrating a second insulating film 26 and connected to a third diffusion layer 36 of the peripheral circuit transistor is formed, a second conductive spacer 61 in contact with the top face of the third contact plug 37 is formed so that side faces thereof are covered with a third insulating film 33, and a cap layer 51 is left on the top face of the second conductive spacer 61 in a similar manner to that in FIGS. 3A to 6B.

Next, a TEOS (Tetra Ethyl Ortho Silicate) film is formed, for example, by a CVD method as an interlayer insulating film 73 on the third insulating film 33, a ferroelectric film 29 and the cap layer 51. And, grooves 74a, 74b and 74c corresponding to an electrode wiring pattern are formed on the interlayer insulating film 73 by a photolithography method. Interlayer insulating films 73a and 73b are left portions of the interlayer insulating film 73.

Figure 10B:
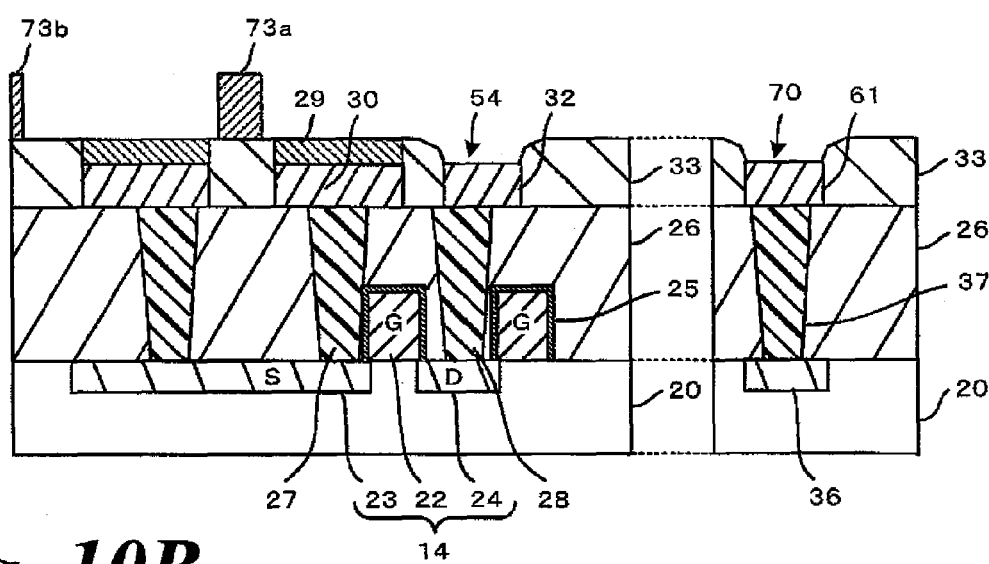

Next, as shown in FIG. 10B, the cap layer 51 on the first conductive spacer 32 and the second conductive spacer 61 is removed selectively at room temperature using phosphoric acid to expose the top faces thereof from a first opening 54 and a second opening 70 as in FIG. 7A.

Figure 11A:
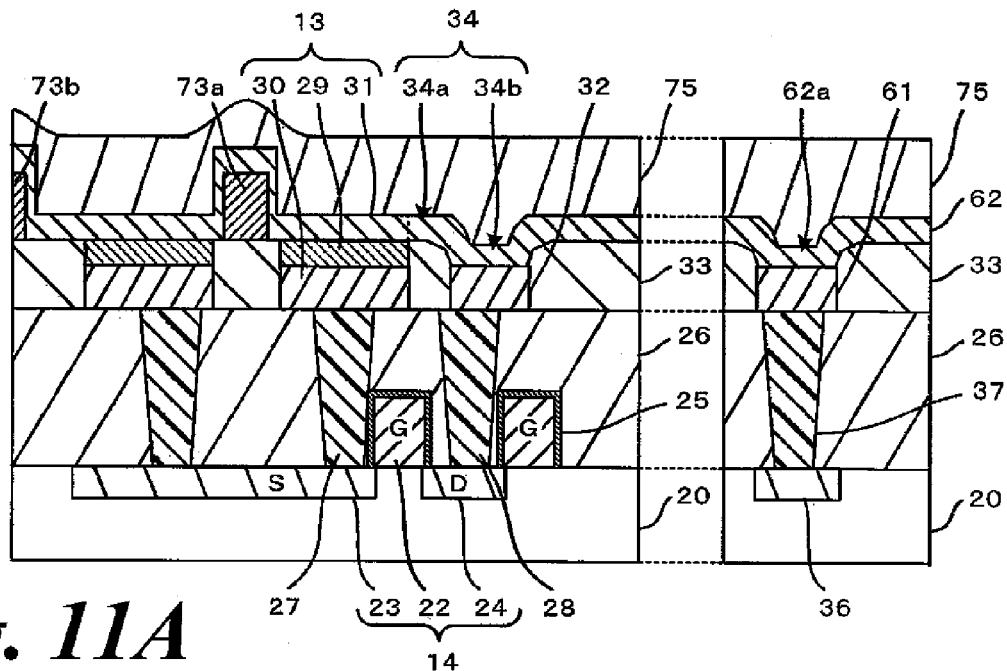
FIGS. 11A and 11B are sectional views to of manufacturing steps of the different nonvolatile memory according to the second embodiment.

Next, as shown in FIG. 11A, a second electrode material film 55 is formed by a sputtering method on the third insulating film 33, the ferroelectric film 29, the first conductive spacer 32 and the second conductive spacer 61, and a copper film 75 is formed thereon through a barrier film (TaN, TiN, etc.).

The second electrode material film 55 is thinner than the interlayer insulating films 73a and 73b and is formed on the second electrodes 31, the first wiring 34 and the second wiring 62 so as to be lifted off by the interlayer insulating films 73a and 73b. The copper film 75 is thicker than the interlayer insulating films 73a and 73b and is formed to cover the interlayer insulating films 73a and 73b.

Figure 11B:
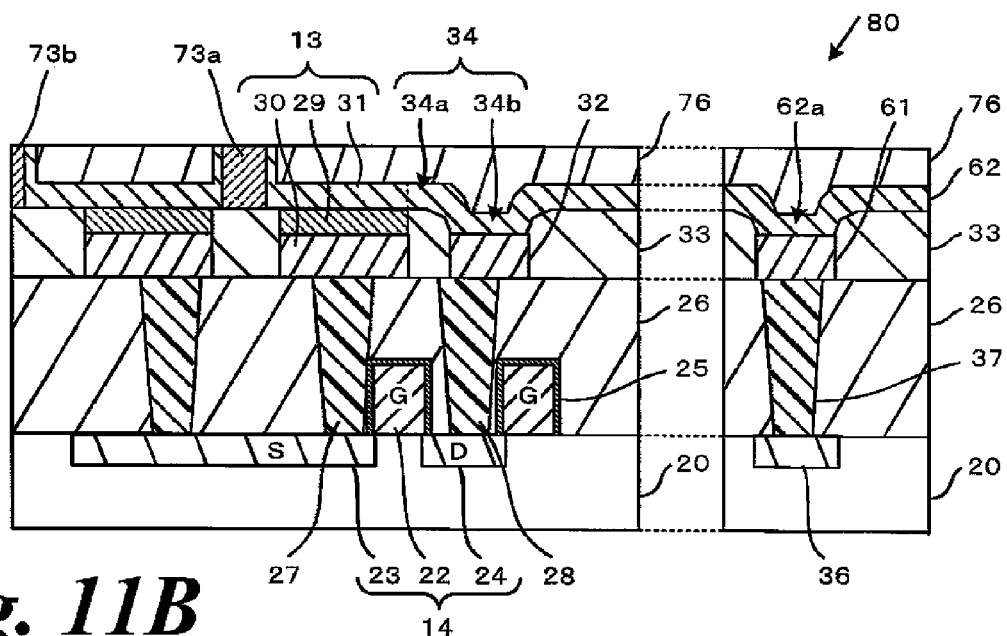

Next, as shown in FIG. 11B, an extra copper film 75 is removed until the interlayer insulating films 73a and 73b are exposed by a CMP method, thereby forming a metal film 76 on the second electrodes 31, the first wiring 34 and the second wiring 62 so as to have a flat surface. Accordingly, the nonvolatile memory 80 is manufactured.

According to an aspect of the present invention, there are provided a nonvolatile memory in which the wiring connecting the top electrode of the ferroelectric capacitor and the diffusion layer of the cell transistor is formed in a self-alignment manner and a manufacturing method thereof.

What is claimed is:

1. A nonvolatile memory comprising:
   a semiconductor substrate;
   a cell transistor comprising:
      a gate electrode on a first face of the semiconductor substrate through a gate insulating film;
      a first insulating film over a top face and a side face of the gate electrode; and
      first and second diffusion layers with the gate electrode in a gate length direction between the first and second diffusion layers;
   a second insulating film on the semiconductor substrate over the cell transistor;
   a first contact plug through the second insulating film configured to connect to the first diffusion layer;
   a second contact plug through the second insulating film configured to connect to the second diffusion layer;
   a ferroelectric capacitor comprising a ferroelectric film between first and second electrodes, the first electrode is connected to a top face of the first contact plug;
   a first conductive spacer connected to a top face of the second contact plug comprising a first material in the first electrode;
   a third insulating film on the second insulating film and over side faces of the first electrode, the ferroelectric film and the first conductive spacer, the third insulating film comprising a first opening exposing a top face of the first conductive spacer; and
   a first wiring on the third insulating film comprising a first portion configured to connect to the second electrode and a second portion connected to the first conductive spacer through the first opening comprising a second material in the second electrode.

2. The nonvolatile memory of claim 1, further comprising:
   a peripheral circuit transistor next to the cell transistor on the semiconductor substrate comprising a third diffusion layer;
   a third contact plug through the second insulating film, configured to connect to the third diffusion layer;
   a second conductive spacer configured to connect to a top face of the third contact plug comprising the second material; and
   a second wiring comprising a first portion on the second conductive spacer through a second opening of the third insulating film exposing a top face of the second conductive spacer, comprising the second material.

3. The nonvolatile memory of claim 1,
   wherein a resistance of the first material is smaller than a resistance of the second material.

4. The nonvolatile memory of claim 2, further comprising:
   a metal film on the second wiring.

5. The nonvolatile memory of claim 4,
   wherein a resistance of the material of the metal film is smaller than a resistance of the second material.

6. The nonvolatile memory of claim 1,
   wherein the second electrode and the first wiring are in one piece.

7. The nonvolatile memory of claim 1, further comprising:
   a metal film on the second electrode and the first wiring.

8. The nonvolatile memory according to claim 7,
   wherein a resistance of the material of the metal film is smaller than a resistance of the second material.

9. The nonvolatile memory of claim 1,
   wherein a peripheral edge of the first opening is gently formed.

10. The nonvolatile memory of claim 2,
    wherein a peripheral edge of the second opening is gently formed.

11. The nonvolatile memory of claim 1,
    wherein a surface of the first wiring and a surface of the first conductive spacer connecting to the surface of the first wiring comprise the same shape.

12. The nonvolatile memory of claim 2,
    wherein a surface of the second wiring and a surface of the second conductive spacer connecting to the surface of the second wiring comprise the same shape.

* * * * *